United States Patent
Leenerts et al.

(10) Patent No.: US 7,030,689 B2
(45) Date of Patent: Apr. 18, 2006

(54) ISOLATED DC-TO-DC CONVERTER

(75) Inventors: Virgil George Leenerts, Loveland, CO (US); David Paul Kjosness, Longmont, CO (US); Gerald Irwin Raak, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 30 days.

(21) Appl. No.: 10/791,446

(22) Filed: Mar. 2, 2004

(65) Prior Publication Data

US 2005/0195025 A1 Sep. 8, 2005

(51) Int. Cl.
 *H03F 3/38* (2006.01)

(52) U.S. Cl. .................. 330/10; 330/140; 330/165; 330/297

(58) Field of Classification Search .................. 330/10, 330/297
See application file for complete search history.

(56) References Cited

U.S. PATENT DOCUMENTS

| | | | |
|---|---|---|---|
| 5,777,519 A * | 7/1998 | Simopoulos | 330/297 |
| 5,907,479 A | 5/1999 | Leu | |
| 5,986,895 A | 11/1999 | Stewart et al. | |
| 6,535,399 B1 * | 3/2003 | Gu | 363/17 |
| 6,711,034 B1 * | 3/2004 | Duerbaum et al. | 363/16 |
| 6,741,436 B1 * | 5/2004 | Gilbert et al. | 361/18 |
| 6,775,524 B1 * | 8/2004 | Takeyabu et al. | 330/297 |
| 6,865,094 B1 * | 3/2005 | Malik et al. | 363/21.12 |
| 2001/0022737 A1 | 9/2001 | Arai | |

* cited by examiner

*Primary Examiner*—Khanh V. Nguyen

(57) ABSTRACT

An isolated direct-current to direct-current (DC-to-DC) converter and associated method are provided which employ a class-D amplifier. An alternating current (AC) input voltage and a DC input voltage drive the class-D amplifier to produce an AC primary voltage. The AC primary voltage then drives a primary winding of a transformer, thereby generating an AC secondary voltage at a secondary winding of the transformer. The AC secondary voltage then drives a rectifier, yielding a rectified voltage. A low-pass filter is then accepts the rectified voltage to produce a DC output voltage.

34 Claims, 4 Drawing Sheets

ISOLATED DC-TO-DC CONVERTER

BACKGROUND OF THE INVENTION

Most types of consumer and commercial electronic equipment produced today require electrical power provided via alternating current (AC) power lines, which are typically referenced to earth ground. Such equipment typically employ power supplies that convert the voltages of the AC power lines to some level of direct current (DC) voltage to provide power of a more useful form to the internal circuits of the equipment. However, much of this equipment requires galvanic (i.e., DC) isolation between portions of their resident circuitry and earth ground for proper circuit operation and user safety. As a result, the power supplies employed by electronic equipment generally provide that isolation.

Such an isolated power supply ideally possesses a number of characteristics. The supply should accept a wide range of AC power line voltages while producing a stable, constant DC voltage. Hopefully, this function is performed with essentially no power loss, and without producing any undesirable side effects that adversely impact the performance of the associated equipment.

One such side effect commonly produced by power supplies is injected current, which is common-mode AC current induced in the DC outputs of a power supply due to coupling between the isolated and non-isolated portions of the supply. Typically, inter-winding capacitance in a power transformer within the power supply provides the major source of such coupling. As a result, the injected current produced depends to some degree on the magnitude of the inter-winding capacitance, as well as the magnitude, primary frequency, and harmonic content of the driving voltage applied at the terminals of the primary winding of the transformer.

For example, a traditional isolated power supply 100, as shown in FIG. 1, normally exhibits some level of injected current. An AC line voltage $V_{ACL}$, normally with an amplitude between 90 and 264 volts root-mean-square (RMS), drives the primary windings of a power isolation transformer 110, thereby inducing a smaller AC voltage $V_{ACT}$ in the transformer secondary windings. This voltage then drives a rectifier 120, which converts the smaller AC voltage $V_{ACT}$ into a half-wave or full-wave rectified voltage $V_{ACR}$. A low-pass filter 130 then converts the rectified voltage $V_{ACR}$ into a DC voltage $V_{DCR}$ exhibiting some small AC "ripple." In some cases, a voltage regulator 140 is then employed to generate a DC output voltage $V_{DCO}$ with reduced AC ripple, while also providing some DC voltage level stability against amplitude changes in the AC line voltage $V_{ACL}$.

Usually, the rather high amplitude of the AC line voltage $V_{ACL}$ produces a high level of injected current by way of the aforementioned inter-winding capacitance of the power transformer 110. In order to mitigate the level of the injected current, special winding techniques and electrostatic shielding are employed to reduce the capacitance, but at the expense of a more costly transformer.

Additionally, the traditional power supply 100 normally exhibits low power efficiency. This characteristic is caused by a relatively low transformer primary-to-secondary winding ratio to ensure that the smaller AC voltage $V_{ACT}$ is of a sufficiently high magnitude when the AC line voltage $V_{ACL}$ is at a minimum. Therefore, when the AC line voltage $V_{ACL}$ is higher than its minimum, the smaller AC voltage $V_{ACT}$ is higher than necessary to provide the required DC output voltage $V_{DCO}$, resulting in higher power dissipation, sometimes resulting in power efficiency as low as 50%, or less.

Furthermore, in order to produce the same DC voltage for a wide range of AC line voltages $V_{ACL}$, the transformer 110 often employs multiple windings and taps to allow different AC line voltages $V_{ACL}$ to produce the same DC output voltage $V_{DCO}$. The tap to be used in a particular circumstance is selected by way of a user-settable switch. While such a design lends flexibility with respect to the various AC power line voltages with which the associated equipment may be used, increased hardware costs and possible equipment damage due to an incorrect switch setting result.

To address this efficiency problem, a switch-mode DC-to-DC converter 200, as displayed in FIG. 2, may be employed as part of a larger power supply. First, an AC power line voltage (not shown) is converted to a relatively high DC input voltage $V_{DCI}$ by way of rectifiers and filter capacitors (also not shown), typically by way of a line voltage selector switch. The DC input voltage $V_{DCI}$ is then quickly switched ON and OFF intermittently via an electronic switch circuit 210 (typically comprising a set of transistors), resulting in a switched DC voltage $V_{DCS}$. The switched voltage $V_{DCS}$, alternating between the magnitude of the DC input voltage $V_{DCI}$ and zero volts (or the "open" state) is then applied to the primary winding of an isolation transformer 230 to generate a transformed DC switched signal $V_{DCT}$ at the secondary winding. This voltage is then rectified by a rectifier 240 to produce a rectified voltage $V_R$, which may then be passed to a low-pass filter 250 to reduce any AC components of that voltage $V_R$, thus resulting in a final DC output voltage $V_{DCO}$.

The magnitude of the DC output voltage $V_{DCO}$ is influenced primarily by the operation of the electronic switch circuit 210, which is managed by a control circuit 220. More specifically, the higher the duty cycle of the switches (i.e., the longer they are in the closed or ON state), the higher the DC output voltage $V_{DCO}$. Thus, the control circuit 220 monitors the DC output voltage $V_{DCO}$ to adjust the duty cycle properly, often through an isolation circuit 260 to maintain galvanic isolation between the AC input power line and the output of the DC-to-DC converter 200.

Many such converters 200 available today can tolerate a wide range of DC power line voltages without the need for multiple taps or a switch. Power supplies that utilize such a converter 200 are termed "universal-input" power supplies.

Another advantage of such a design is that the use of an electronic switch circuit 210 results in the transistors involved transitioning into either the ON (saturated) or OFF (non-conducting) state very quickly, resulting in very little power loss, making the DC-to-DC converter 200 quite efficient. However, this design also results substantially in a square wave for the switched DC voltage $V_{DCS}$ being applied directly to the transformer. Such a signal possesses a strong harmonic content at high frequencies, thus producing a significant amount of injected current into the non-isolated portion of the converter 200.

Also, to allow the use of a smaller transformer and other components, the control circuit 220 typically drives the switches at a much higher frequency (e.g., 20 kilohertz (kHz) to a few megahertz (MHz)) than that of an AC power line.

Unfortunately, such high frequencies easily couple though the inter-winding capacitance of the transformer 230, therefore augmenting the injected current produced. Additionally, the fact that the magnitude of the switched DC voltage $V_{DCS}$ is relatively high further exacerbates this phenomenon.

As a result, given the foregoing discussion, a need currently exists for an isolated DC-to-DC converter that exhibits improved reduction of injected current.

SUMMARY OF THE INVENTION

Embodiments of the invention, to be discussed in detail below, provide an improved isolated DC-to-DC converter and associated method which employ a class-D amplifier. An AC input voltage, in conjunction with a DC input voltage, drives the class-D amplifier to generate an AC primary voltage. The AC primary voltage drives a primary winding of a transformer to generate an AC secondary voltage at a secondary winding of the transformer. The AC secondary voltage then drives a rectifier, which in turn drives a low-pass filter, which produces a DC output voltage.

Other aspects and advantages of the invention will become apparent from the following detailed description, taken in conjunction with the accompanying drawings, illustrating by way of example the principles of the invention.

DETAILED DESCRIPTION OF EMBODIMENTS OF THE INVENTION

Figure 2:
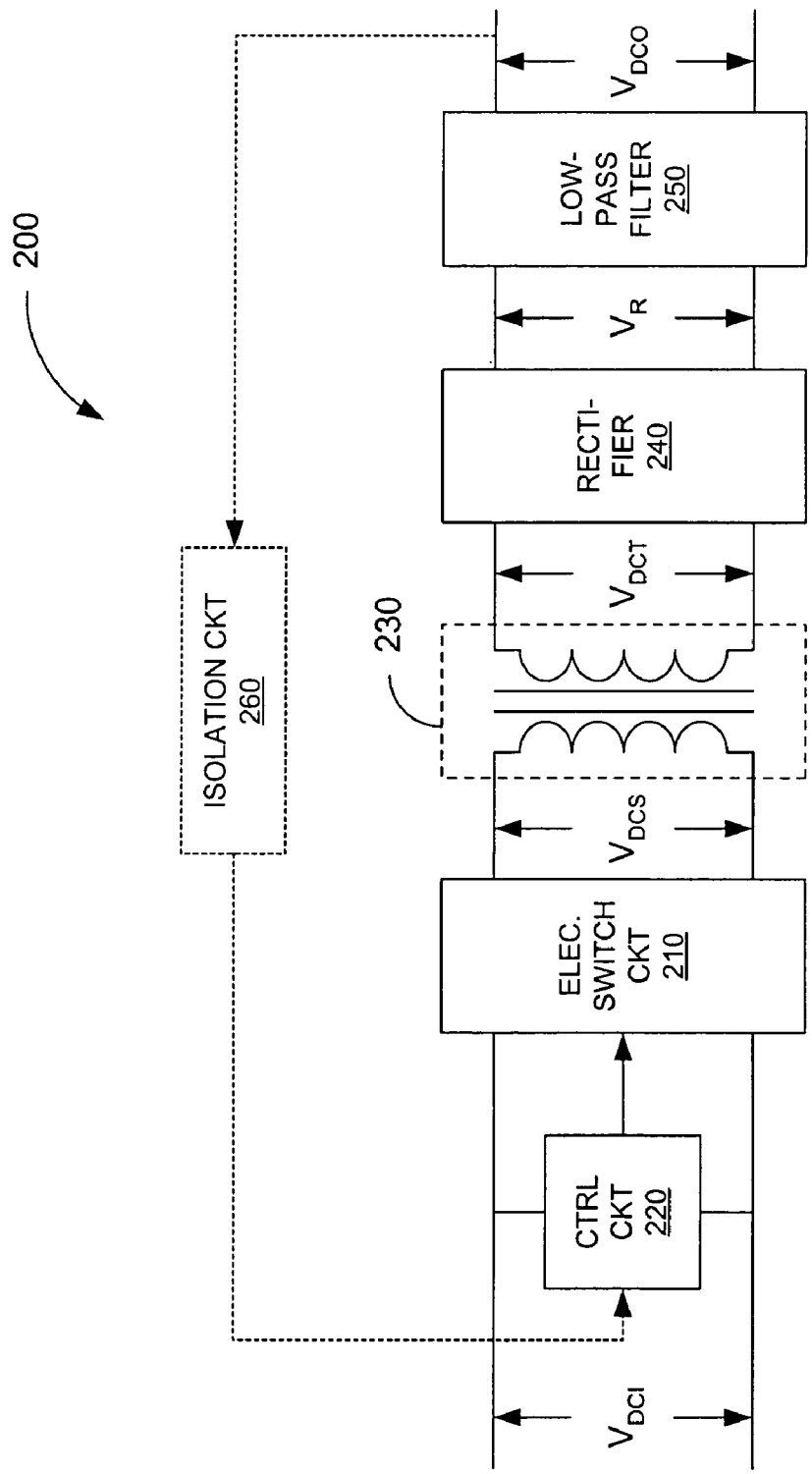
FIG. 2 is a block diagram of an isolated DC-to-DC converter from the prior art.
Figure 3:
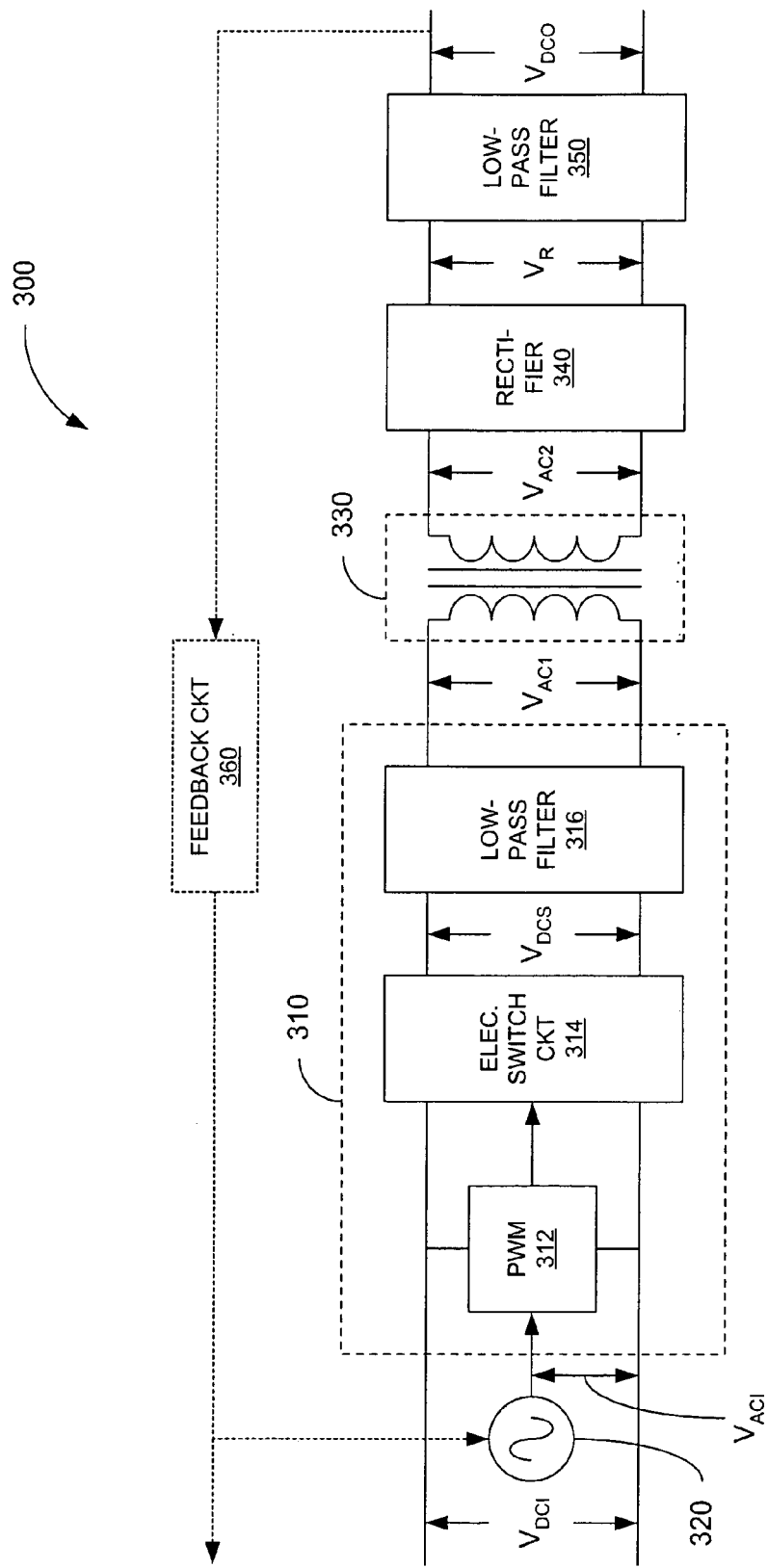
FIG. 3 is a block diagram of an improved DC-to-DC converter with reduced injection current according to an embodiment of the invention.

One possible embodiment of the present invention, a low injected current, isolated DC-to-DC converter 300, is shown in FIG. 3. Similar to the converter 200 of FIG. 2, the improved converter 300 uses as input a DC input voltage $V_{DCI}$, which may be derived initially from an AC power line source. As discussed above, the AC line voltage may be converted to the DC input voltage $V_{DCI}$ by way of an AC-to-DC voltage converter, typically consisting primarily of rectifiers and filter capacitors, although other means known in the art may also be employed.

Instead of generating the switched DC voltage $V_{DCS}$ of the converter 200 of FIG. 2, which is essentially a square wave containing significant high-frequency harmonics, and applying it directly to a transformer, an AC primary voltage $V_{AC1}$ with less high-frequency harmonic content is ultimately produced for that purpose. To this end, an AC input voltage source 320 with limited high-frequency harmonic content is employed to generate an AC input voltage $V_{ACI}$ which drives the control input of a class-D amplifier 310 to generate the AC primary voltage $V_{AC1}$. In the embodiments of the invention disclosed below, such a configuration produces a highly-efficient voltage conversion while limiting the amount of injected current produced.

Ideally, the AC input voltage $V_{ACI}$ generated by the AC input voltage source 320 would be sinusoidal in nature to eliminate any harmonics above the primary frequency. However, other AC input voltage sources may be employed to similar effect. For example, a 4-bit stepped approximation of an AC sinusoidal voltage, although containing some attenuated high-frequency components, may be used advantageously. Also, a low-pass-filtered square wave may be employed as well. While non-sinusoidal AC voltage sources may allow some minor injected current to be produced, some circuits being driven by the converter 300 are not as susceptible to improper operation at lower levels of injected current. Additionally, non-sinusoidal voltage sources, as employed in the converter 300, still allow efficient voltage conversion to occur.

Depending on the needs of the user, the AC input voltage source 320 may be integrated within the converter 300, or may be provided externally. Integrating the AC voltage source 320 within the converter 300 reduces the number of external connections required and possibly the overall amount of space consumed. However, when multiple converters 300 are to be employed, a single externally-provided AC voltage source 320 may drive several converters 300, thus providing synchronous operation of those converters 300 while reducing the overall size of the voltage conversion system.

The class-D amplifier 310 is shown with its various functional blocks in FIG. 3. In this embodiment, the AC input voltage $V_{ACI}$ generated by the AC voltage source 320 drives a pulse width modulator (PWM) 312. The PWM 312, in turn, controls an electronic switch circuit 314, which operates in a manner similar to the electronic switch circuit 210 of FIG. 2. The switches (typically transistors) of the electronic switch circuit 314 cause a switched DC voltage $V_{DCS}$ derived from the DC input voltage $V_{DCI}$ to be produced, whereby the switched DC voltage $V_{DCS}$ alternates between the magnitude of the DC input voltage $V_{DCI}$ and zero volts (or the open state). The PWM 312 causes those switches to turn ON and OFF at a relatively high constant frequency, with the duty cycle of the switches being proportional to the AC input voltage $V_{ACI}$. The minimum frequency of the switching by the PWM 312 is the Nyquist frequency, or about twice the frequency of the AC sinusoidal voltage $V_{ACS}$. Typically, however, the switching frequency will be at least four times that of the AC sinusoidal voltage $V_{ACS}$. The switched DC voltage $V_{DCS}$ is then filtered by way of a low-pass filter 316 designed to remove harmonic components at the switching frequency and above so that the output of the low-pass filter 316, the primary AC voltage $V_{AC1}$, is generated. As a result, the primary AC voltage $V_{AC1}$ is essentially proportional to the AC input voltage $V_{ACI}$ generated by the AC input voltage source 320.

The primary AC voltage $V_{AC1}$ then drives the primary winding of an isolation transformer 330, as is seen in other DC-to-DC converters of the prior art. However, since the primary winding is being driven by an AC signal of limited high-frequency content, as opposed to a high-magnitude, high-frequency switched DC signal, fewer high-frequency components are present at the primary winding of the transformer 330. Ideally, only the fundamental frequency of the AC input voltage $V_{ACI}$ will be present at that stage. Therefore, substantially less current is injected into the isolated portion of the converter 300 due to any interwinding capacitance within the isolation transformer 330.

Due to the primary winding of the transformer being driven by an AC voltage containing limited high-frequency harmonics, the voltage generated by the secondary winding, secondary AC voltage $V_{AC2}$, is also limited in the same fashion, and is proportional to the primary AC voltage $V_{AC1}$. The secondary AC voltage $V_{AC2}$ is then half-wave or full-wave rectified by way of a rectifier 340, resulting in a rectified voltage $V_R$, and then filtered by a low-pass filter 350 to generate a DC output voltage $V_{DCO}$.

In addition to the specific benefits of the class-D amplifier 310 regarding low injected current, other measures aimed at reducing the injected current further may be employed. For example, class-D amplifiers may be designed to drive the two terminals of the primary windings of the transformer 330 with voltages of equal amplitude and opposite polarity, resulting in an average voltage at the primary terminals of zero relative to ground, thus further reducing the injected current into the isolated portion of the converter 300. This method of driving the primary windings is in contrast to the more typical method of driving the AC primary voltage $V_{AC1}$ at one terminal while holding the other terminal at a single reference voltage, such as ground. Also, as indicated above, special winding and shielding to reduce inter-winding capacitance between the primary and secondary windings of the transformer 330 can also be employed to reduce injected current further.

Assuming the magnitude of the DC input voltage $V_{DCI}$ and the amplitude of the AC input voltage $V_{ACI}$ are constant, the isolated DC output voltage $V_{DCO}$ will remain regulated to a degree. However, since the converter 300, like essentially all electronic systems, exhibits some non-zero output impedance, the DC output voltage $V_{DCO}$ may be affected by the amount of current at the output, and thus the size of the load placed on the output. To improve regulation of the output, a feedback circuit 360, as shown in FIG. 3, may be added to the converter 300 so that, for example, either the magnitude of the DC input voltage $V_{DCI}$ or the amplitude of the AC input voltage $V_{ACI}$ may be modified depending on a measured level of the DC output voltage $V_{DCO}$. Such modification results in a change in the amplitude of the primary AC voltage $V_{AC1}$, which, in turn, affects the amplitude of the secondary AC voltage $V_{AC2}$, and hence, the DC output voltage $V_{DCO}$.

Advantageously, since the isolation transformer 330 is driven by an AC voltage with a primary frequency and limited harmonics (ideally, sinusoidal), any noise that may be imparted by the DC-to-DC converter 300 into the equipment employing the converter 300 will likely be of that primary frequency and its harmonics. Noise that is produced in such a limited frequency spectrum allows the equipment utilizing the converter 300 to reject that noise more easily. For example, a digital volt meter (DVM) typically is designed to reject the normal AC power line frequencies of 50 and 60 Hz, plus harmonics of those base frequencies. In this case a beneficial design choice for the converter 300 would be to employ a primary frequency for the AC input voltage $V_{ACI}$ of 300 Hz, which is a harmonic of both 50 Hz and 60 Hz. Therefore, the DVM would substantially reject any noise produced by the converter 300 as a result of the normal design choices in rejecting the normal AC power line frequencies.

Figure 1:
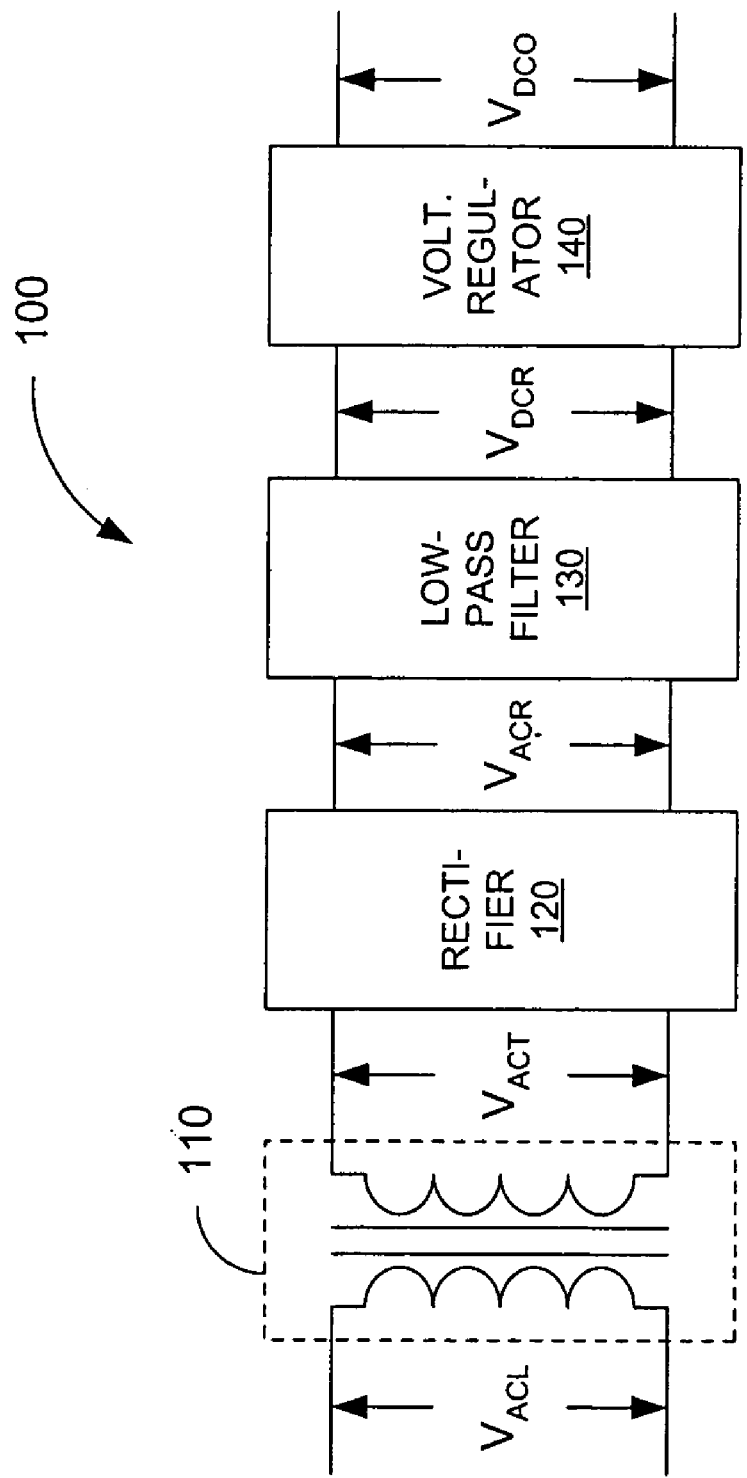
FIG. 1 is a block diagram of a traditional isolated power supply from the prior art.

As mentioned above, the converter 300 of FIG. 3 also represents a highly efficient DC-to-DC conversion solution. Generally speaking, class-D amplifiers are known by those in the pertinent art to be extremely efficient in terms of power dissipation. Most such amplifiers exhibit a power efficiency of more than 90 percent, with some approaching nearly 100 percent. Since the class-D amplifier 310 of the converter 330 of FIG. 1 represents a large portion of the overall converter design, and power losses in the remaining portions of the converter 300 (the AC input voltage source 320, the isolation transformer 330, the rectifier 340, and the low-pass filter 350) can normally be minimized through proper electronic design techniques known in the art, the overall power loss will be comparatively low.

Figure 4:
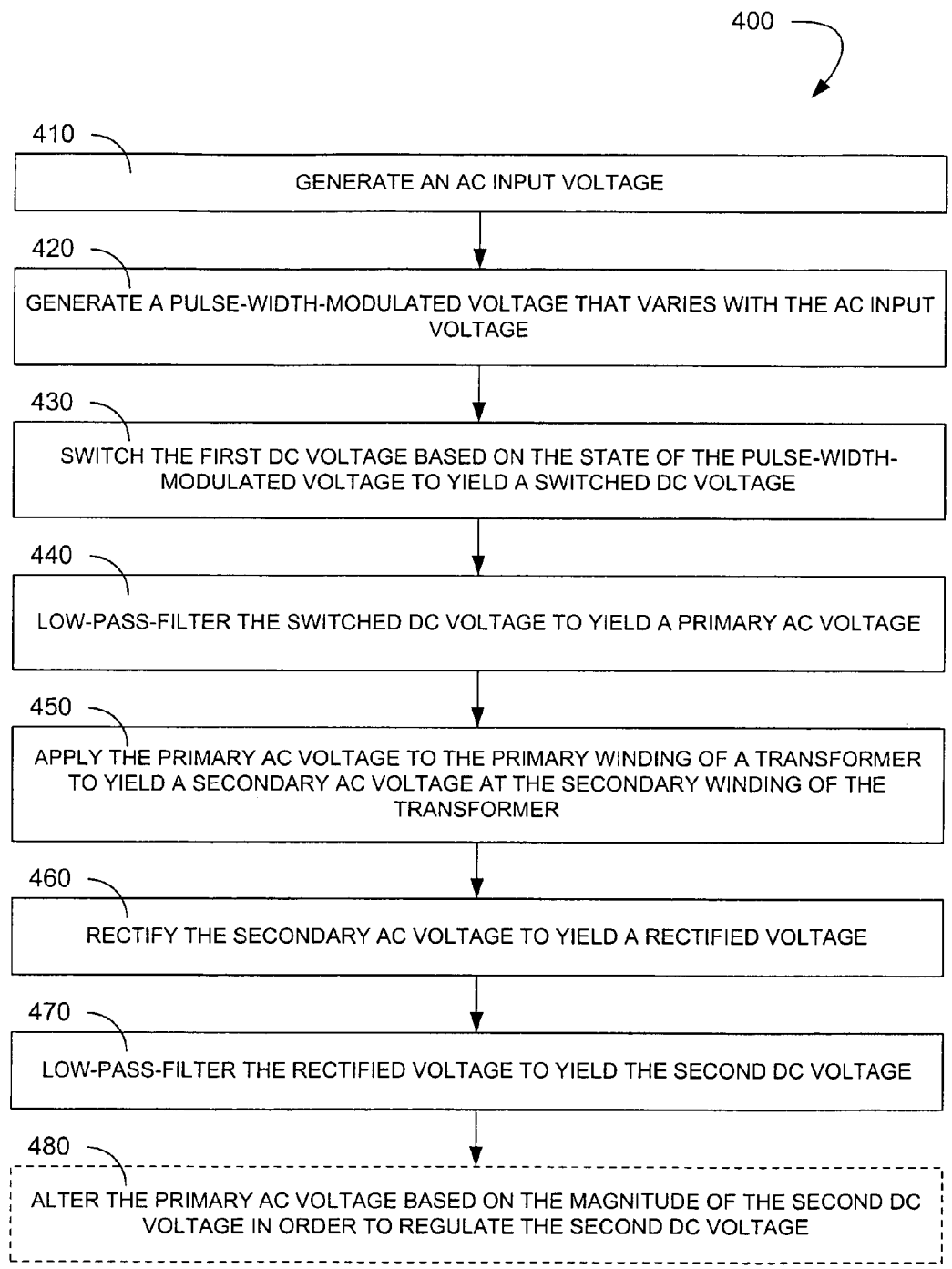
FIG. 4 is a flow diagram of a method for converting a first DC voltage to a second DC voltage according to an embodiment of the invention.

Other embodiments of the current invention may also take the form of a method 400 of converting a first DC voltage to a second DC voltage, as shown in FIG. 4. First, an AC input voltage is generated (step 410), which is ideally sinusoidal in nature, although other signals as described earlier may be used as well. That signal is then used to generated a pulse-width-modulated voltage whose pulse width varies with the AC input voltage (step 420). The first DC voltage is then switched ON and OFF based on the state of the pulse-width-modulated voltage, resulting in a switched DC voltage (step 430). The switched DC voltage is then low-pass-filtered (step 440), thereby generating a primary AC voltage to be applied to the primary winding of an isolation transformer, resulting in a secondary AC voltage at the secondary winding of the transformer (step 450). The secondary AC voltage is then rectified to yield a rectified voltage (step 460), which is low-pass-filtered (step 470), resulting in the second DC voltage. Optionally, the second DC voltage may be employed as feedback for altering the magnitude of the primary AC voltage so that the second DC voltage is regulated (step 480). This altering step may be performed, for example, by altering the magnitude of the first DC voltage or the amplitude of the AC input voltage.

From the foregoing, embodiments of the invention provide an isolated DC-to-DC converter with less injected current than what was typically available previously. Additionally, such embodiments normally provide this functionality with comparatively high power efficiency. Specific embodiments of the invention other than those shown above are also possible. As a result, the invention is not to be limited to the specific forms so described and illustrated; the invention is limited only by the claims.

What is claimed is:

1. An isolated direct-current-to-direct-current (DC-to-DC) converter, comprising:
   a class-D amplifier configured to be driven by an alternating current (AC) input voltage and a DC input voltage, the class-D amplifier thus configured to generate an AC primary voltage;
   a transformer having a primary winding configured to be driven by the AC primary voltage, the transformer thus configured to generate an AC secondary voltage at a secondary winding;
   a rectifier configured to be driven by the AC secondary voltage, the rectifier thus configured to generate a rectified voltage;
   a first low-pass filter configured to be driven by the rectified voltage, the low-pass filter thus configured to produce a DC output voltage; and
   a second low pass filter connected to the primary winding, wherein the second low-pass filter is adapted to remove harmonic components of a switching frequency.

2. The isolated DC-to-DC converter of claim 1, wherein the AC input voltage is sinusoidal.

3. The isolated DC-to-DC converter of claim 1, wherein the AC input voltage is a four-bit approximation of an AC sinusoidal voltage.

4. The isolated DC-to-DC converter of claim 1, wherein the AC input voltage is a low-pass-filtered square wave voltage.

5. The isolated DC-to-DC converter of claim 1, further comprising an AC input voltage source configured to generate the AC input voltage.

6. The isolated DC-to-DC converter of claim 1, wherein the primary frequency of the AC input voltage is approximately 300 Hz.

7. The isolated DC-to-DC converter of claim 1, wherein the rectifier is a full-wave rectifier.

8. The isolated DC-to-DC converter of claim 1, wherein the rectifier is a half-wave rectifier.

9. The isolated DC-to-DC converter of claim 1, wherein the class-D amplifier drives a terminal of the primary winding with the AC primary voltage while maintaining a second terminal of the primary winding at a constant voltage.

10. The isolated DC-to-DC converter of claim 1, wherein the class-D amplifier drives the terminals of the primary winding of the transformer with voltages of equal amplitude and opposite polarity.

11. The isolated DC-to-DC converter of claim 1, wherein the class-D amplifier further comprises:
   an electronic switch circuit configured to switch intermittently the DC input voltage, the electronic switch circuit thus configured to produce a switched DC voltage; and
   a pulse width modulator (PWM) configured to be driven by the AC input voltage, the PWM thus configured to control the electronic switch circuit wherein the second low pass filter is configured to be driven by the switched DC voltage and to generate the AC primary voltage.

12. The isolated DC-to-DC converter of claim 11, wherein the PWM operates at a frequency at least four times the primary frequency of the AC input voltage.

13. The isolated DC-to-DC converter of claim 11, wherein the second low pass filter removes harmonic components of the switched DC voltage equal to and greater than the switching frequency of the switched DC voltage.

14. The isolated DC-to-DC converter of claim 1, further comprising a feedback circuit configured to adjust the amplitude of the AC input voltage based on the magnitude of the DC output voltage in order to regulate the DC output voltage.

15. The isolated DC-to-DC converter of claim 1, further comprising a feedback circuit configured to adjust the magnitude of the DC input voltage based on the magnitude of the DC output voltage in order to regulate the DC output voltage.

16. A power supply employing the isolated DC-to-DC converter of claim 1.

17. An electronic device employing the isolated DC-to-DC converter of claim 1.

18. An electronic circuit for converting a first direct-current (DC) voltage to a second DC voltage, comprising:
   means for generating a pulse-width-modulated voltage whose pulse width varies with an alternating current (AC) input voltage;
   means for switching the first DC voltage based on the state of the pulse-width-modulated voltage to yield a switched DC voltage;
   means for low-pass-filtering the switched DC voltage to yield a primary AC voltage;
   means for applying the primary AC voltage to a primary winding of a transformer to yield a secondary AC voltage at a secondary winding of the transformer;
   means for rectifying the secondary AC voltage to yield a rectified voltage; and
   means for low-pass-filtering the rectified voltage to yield the second DC voltage.

19. The electronic circuit of claim 18, further comprising means for generating the AC input voltage.

20. A power supply employing the electronic circuit of claim 18.

21. An electronic device employing the electronic circuit of claim 18.

22. A method for converting a first direct-current (DC) voltage to a second DC voltage, comprising:
   generating a pulse-width-modulated voltage whose pulse width varies with an alternating current (AC) input voltage;
   switching the first DC voltage based on the state of the pulse-width-modulated voltage to yield a switched DC voltage;
   low-pass-filtering the switched DC voltage to yield a primary AC voltage;
   applying a primary AC voltage to the primary winding of a transformer to yield a secondary AC voltage at a secondary winding of the transformer;
   rectifying the secondary AC voltage to yield a rectified voltage; and
   low-pass-filtering the rectified voltage to yield the second DC voltage.

23. The method of claim 22, wherein the AC input voltage is sinusoidal.

24. The method of claim 22, wherein the AC input voltage is a four-bit approximation of an AC sinusoidal voltage.

25. The method of claim 22, wherein the AC input voltage is a low-pass-filtered square wave voltage.

26. The method of claim 22, further comprising means for generating the AC input voltage.

27. The method of claim 22 wherein the primary frequency of the AC input voltage is approximately 300 Hz.

28. The method of claim 22, wherein the frequency of the pulse-width-modulated voltage is at least four times the frequency of the AC input voltage.

29. The method of claim 22, wherein the rectified voltage is full-wave rectified.

30. The method of claim 22, wherein the rectified voltage is half-wave rectified.

31. The method of claim 22, wherein the low-pass-filtering step removes harmonic components of the switched DC voltage equal to and greater than the switching frequency of the switched DC voltage.

32. The method of claim 22, further comprising altering the primary AC voltage based on the magnitude of the second DC voltage in order to regulate the second DC voltage.

33. The method of claim 32, wherein the altering step is accomplished by modifying the magnitude of the first DC voltage.

34. The method of claim 32, wherein the altering step is accomplished by modifying the amplitude of the AC input voltage.

* * * * *